United States Patent
Jiang et al.

(10) Patent No.: US 9,899,532 B2
(45) Date of Patent: Feb. 20, 2018

(54) THIN-FILM TRANSISTOR AND MANUFACTURING METHOD THEREOF, ARRAY SUBSTRATE AND MANUFACTURING METHOD THEREOF, AND DISPLAY APPARATUS

(71) Applicant: BOE Technology Group Co., Ltd., Beijing (CN)

(72) Inventors: Chunsheng Jiang, Beijing (CN); Xuyuan Li, Beijing (CN); Wei Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/785,816

(22) PCT Filed: Jun. 19, 2015

(86) PCT No.: PCT/CN2015/081992
§ 371 (c)(1),
(2) Date: Oct. 20, 2015

(87) PCT Pub. No.: WO2016/119380
PCT Pub. Date: Aug. 4, 2016

(65) Prior Publication Data
US 2016/0343864 A1  Nov. 24, 2016

(30) Foreign Application Priority Data
Jan. 28, 2015  (CN) .......................... 2015 1 0044070

(51) Int. Cl.
*H01L 31/18* (2006.01)
*H01L 31/0296* (2006.01)
(Continued)

(52) U.S. Cl.
CPC ...... *H01L 29/7869* (2013.01); *H01L 27/1225* (2013.01); *H01L 29/41733* (2013.01);
(Continued)

(58) Field of Classification Search
CPC ........... H01L 29/7869; H01L 29/66969; H01L 29/78696; H01L 31/0336; H01L 31/03365;
(Continued)

(56) References Cited

U.S. PATENT DOCUMENTS

2003/0092257 A1* 5/2003 Cheng .................... C25D 11/34
  438/633
2009/0057663 A1* 3/2009 Kim .................. H01L 29/78696
  257/43
(Continued)

FOREIGN PATENT DOCUMENTS

CN    1748047 A    3/2006
CN    101578708 A    11/2009
(Continued)

OTHER PUBLICATIONS

14785816_eng translation (machine translation of JPH08264794).*
(Continued)

*Primary Examiner* — Kimberly Rizkallah
*Assistant Examiner* — Brian Turner
(74) *Attorney, Agent, or Firm* — Banner & Witcoff, Ltd.

(57) ABSTRACT

A thin-film transistor (TFT) and a manufacturing method thereof, an array substrate and a manufacturing method thereof, and a display apparatus are provided. The method for manufacturing the TFT includes: forming a gate electrode, a gate insulating layer, a metal oxide semiconductor active layer, a source electrode and a drain electrode on a substrate; the forming the metal oxide semiconductor active layer includes: forming the metal oxide semiconductor
(Continued)

active layer by electrochemical reaction. The method for manufacturing the TFT is applied in the production of the TFT and the array substrate and the display apparatus comprising the TFTs and provides a new method for forming the metal oxide semiconductor active layer.

9 Claims, 3 Drawing Sheets

(51) Int. Cl.
| | |
|---|---|
| H01L 29/786 | (2006.01) |
| H01L 27/12 | (2006.01) |
| H01L 29/66 | (2006.01) |
| H01L 29/51 | (2006.01) |
| H01L 29/417 | (2006.01) |
| H01L 29/49 | (2006.01) |

(52) U.S. Cl.
CPC ........ *H01L 29/4908* (2013.01); *H01L 29/517* (2013.01); *H01L 29/66969* (2013.01); *H01L 29/786* (2013.01)

(58) Field of Classification Search
CPC ............. H01L 31/0352; H01L 31/0248; H01L 31/0392; H01L 31/03529
USPC ........ 257/43, 57, 676, 72, 762; 438/197, 34, 438/57, 633
See application file for complete search history.

(56) References Cited

U.S. PATENT DOCUMENTS

2009/0087939 A1* 4/2009 Lee ..................... H01L 31/0336
 438/57
2011/0315980 A1* 12/2011 Kim ....................... H01L 29/26
 257/43
2015/0241749 A1* 8/2015 Yoon ................ G02F 1/133377
 349/46
2016/0172027 A1* 6/2016 Tahmasebian ..... G11C 13/0016
 257/40

FOREIGN PATENT DOCUMENTS

| CN | 102254950 A | | 11/2011 | |
|---|---|---|---|---|
| CN | 102299182 A | | 12/2011 | |
| CN | 103092417 A | | 5/2013 | |
| CN | 103294256 A | | 9/2013 | |
| CN | 103560114 A | | 2/2014 | |
| CN | 103560114 A | * | 5/2014 | ....... H01L 29/78642 |
| CN | 203882297 U | | 10/2014 | |
| CN | 104638016 A | | 5/2015 | |
| JP | H8264794 A | | 10/1996 | |
| JP | H08264794 | * | 12/2003 | ......... H01L 29/7869 |
| TW | 201439853 A | | 10/2014 | |

OTHER PUBLICATIONS

14785816_NPL (machine translation of CN103560114 with images).*
Aug. 11, 2015—(WO) ISR & WO App No. PCT/CN2015/081992.
Jan. 17, 2017—(CN) First Office Action Appn 201510038860.9 with English Tran.
Jan. 23, 2017—(CN) First Office Action Appn 201510044070.1 with English Trans.
Sep. 5, 2017—(CN) Second Office Action Appn 201510044070.1 with English Tran.

* cited by examiner

THIN-FILM TRANSISTOR AND MANUFACTURING METHOD THEREOF, ARRAY SUBSTRATE AND MANUFACTURING METHOD THEREOF, AND DISPLAY APPARATUS

The application is a U.S. National Phase Entry of International Application No. PCT/CN2015/081992 filed on Jun. 19, 2015, designating the United States of America and claiming priority to Chinese Patent Application No. 201510044070.1, filed on Jan. 28, 2015. The present application claims priority to and the benefit of the above-identified applications and the above-identified applications are incorporated by reference herein in their entirety.

TECHNICAL FIELD

Embodiments of the present invention relate to a thin-film transistor (TFT) and a manufacturing method thereof, an array substrate and a manufacturing method thereof, and a display apparatus.

BACKGROUND

In recent years, with the rapid development of display technology, early cathode ray tube (CRT) display has also been replaced by active-matrix display, e.g., active-matrix liquid crystal display (AMLCD) and active-matrix organic light-emitting diode (AMOLED) display. In these active-matrix displays, TFT, taken as a core device of active-matrix display technology, receives great attention and is widely applied.

According to different materials of active layers in TFTs, the TFTs may be divided into amorphous silicon (a-Si) TFT, polysilicon (poly-Si) TFT, metal oxide TFT, etc. The metal oxide TFT and the poly-Si TFT have higher mobility than the a-Si TFT. Compared with the poly-Si TFT, the manufacturing process of the metal oxide TFT is simpler as there is no limit on devices for ion implantation and laser crystallization. Therefore, the metal oxide TFT is widely applied in liquid crystal displays (LCDs), organic light-emitting diode (OLED) displays and polymer light-emitting diode (PLED) displays.

SUMMARY

Embodiments of the present invention provide a TFT and a manufacturing method thereof, an array substrate and a manufacturing method thereof, and a display apparatus, so as to provide a new method for manufacturing a metal oxide semiconductor active layer.

In one aspect, at least one embodiment of the present invention provides a method for manufacturing a TFT. The method comprises a step of forming a gate electrode, a gate insulating layer, a metal oxide semiconductor active layer, a source electrode and a drain electrode on a substrate. In the method, forming of the metal oxide semiconductor active layer includes: forming the metal oxide semiconductor active layer by electrochemical reaction.

In another aspect, at least one embodiment of the present invention provides a TFT, which comprises a gate electrode, a gate insulating layer, a metal oxide semiconductor active layer, a source electrode and a drain electrode. In the TFT, the metal oxide semiconductor active layer is formed by electrochemical reaction.

In still another aspect, at least one embodiment of the present invention provides an array substrate, which comprises the foregoing TFT.

In still another aspect, at least one embodiment of the present invention provides a method for manufacturing an array substrate, which comprises a step of forming a TFT on a substrate. A method for forming the TFT is the foregoing method for manufacturing the TFT.

In still another aspect, at least one embodiment of the present invention provides a display apparatus, which comprises the foregoing array substrate.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

In the study, the inventors of the application have noted that: currently, the method for forming the metal oxide semiconductor active layer in the metal oxide TFT includes coating a metal oxide semiconductor film on a substrate, etching the metal oxide semiconductor film in the region other than an active region by a patterning process, to form the metal oxide semiconductor active layer disposed in the active region. Therefore, the forming method is relatively simple.

The embodiment of the present invention provides a method for manufacturing a TFT. The method comprises: forming a gate electrode, a gate insulating layer, a metal oxide semiconductor active layer, a source electrode and a drain electrode on a substrate. Moreover, the step of forming the metal oxide semiconductor active layer includes: forming the metal oxide semiconductor active layer by electrochemical reaction. In the method for manufacturing the TFT provided by the embodiment of the present invention, the substrate is taken as a base, does not belong to a structure of the TFT, may be a base substrate not provided with any other structure, and may also be a substrate provided with some layer structures. Of course, the substrate may also be a substrate of any material or shape. No limitation will be given in the embodiment of the present invention.

Figure 1A:
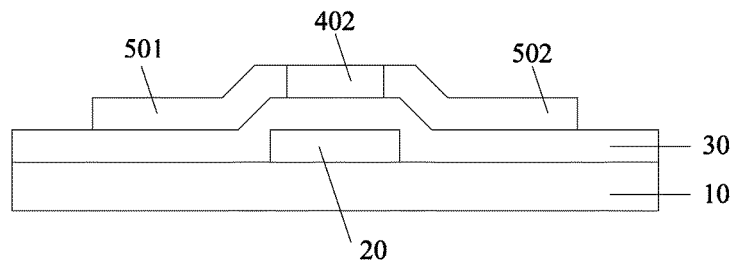
FIG. 1a is a schematic structural view 1 of a TFT provided by an embodiment of the present invention.
Figure 1B:
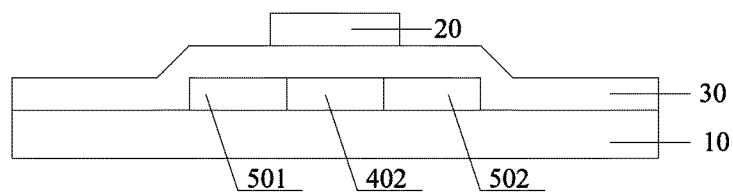
FIG. 1b is a schematic structural view 2 of the TFT provided by an embodiment of the present invention.
Figure 1C:
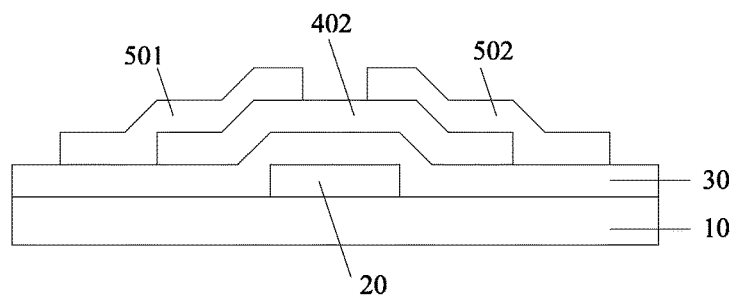
FIG. 1c is a schematic structural view 3 of the TFT provided by an embodiment of the present invention.

It should be noted that: firstly, for instance, a bottom-gate TFT as shown in FIGS. 1a and 1c and a top-gate TFT as shown in FIG. 1b may be manufactured by the above manufacturing method. But the embodiment of the present invention is not limited thereto, as long as a metal oxide semiconductor active layer 402 in the TFT can be formed by electrochemical reaction.

In the embodiment of the present invention, the relative positions of the metal oxide semiconductor active layer 402, a source electrode 501 and a drain electrode 502 are not limited. The metal oxide semiconductor active layer 402, the source electrode 501 and the drain electrode 502 may be arranged in the same layer and may also be arranged in different layers.

Secondly, the process of the electrochemical reaction and the material of the active region before the electrochemical reaction are not limited, as long as the metal oxide semiconductor active layer 402 can be formed in the active region by electrochemical reaction.

The embodiment of the present invention provides a method for manufacturing a TFT. The method comprises: forming a gate electrode 20, a gate insulating layer 30, a metal oxide semiconductor active layer 402, a source electrode 501 and a drain electrode 502 on a substrate 10. In the method, the metal oxide semiconductor active layer 402 is formed by electrochemical reaction. Compared with the way of coating the metal oxide semiconductor film on the substrate, etching the metal oxide semiconductor film in the region other than the active region by a patterning process, to form the metal oxide semiconductor active layer disposed in the active region, the embodiment of the present invention provides a new method for manufacturing the metal oxide semiconductor active layer 402.

For instance, the metal oxide semiconductor active layer is of a $Cu_2O$ semiconductor material.

In general, when Cu metal is diffused into an a-Si or poly-Si semiconductor layer, semiconductor material may change into a conductor, or the performances of the semiconductor layer may also be affected even the semiconductor material does not reach the mobility of a conductor. In an embodiment of the present invention, as the metal oxide semiconductor active layer 402 is of $Cu_2O$, even though a electrode material (e.g., the material of the source electrode and the drain electrode) adopts Cu metal, when $Cu_2O$ and Cu metal contact, balance may be formed between $Cu_2O$ and the diffusion of Cu, and hence a stable performance of the semiconductor layer can be guaranteed. That is to say, the metal oxide semiconductor active layer 402 will not be sensitive to the diffusion effect of the Cu metal.

Moreover, considering that the Cu metal has large reserve volume in nature and is relatively cheap, thus, for instance, the metal oxide semiconductor active layer 402 of a $Cu_2O$ semiconductor material is formed by the electrochemical reaction on Cu metallic material.

On this basis, a first pattern of a Cu metallic material may be formed in the active region at first; subsequently the Cu metallic material is converted into $Cu_2O$ semiconductor material by electrochemical reaction; and hence the metal oxide semiconductor active layer 402 is formed by the first pattern. That is to say, in at least one embodiment, the step of forming the metal oxide semiconductor active layer may include: forming a metal film on the substrate; forming the first pattern disposed in the active region by performing one patterning process on the metal film; and forming the first pattern into the metal oxide semiconductor active layer by the electrochemical reaction. The embodiment of the present invention is only illustrated by taking the case that the metal oxide semiconductor active layer 402 of the $Cu_2O$ semiconductor material is formed by the electrochemical reaction on the Cu metallic material as an example, but is not limited thereto.

Of course, the step of forming the metal oxide semiconductor active layer may also include: forming a film of a metallic material on the substrate; converting the film of the metallic material into a film of the metal oxide semiconductor material by the electrochemical reaction; and removing the film of the metal oxide semiconductor material in the region other than the active region by a patterning process to form the metal oxide semiconductor active layer in the active region. For instance, a film of a Cu metallic material may be formed on the substrate at first; then, the film of the Cu metallic material is converted into a film of a $Cu_2O$ semiconductor material by electrochemical reaction; and then, the film of the $Cu_2O$ semiconductor material in the region other than the active region is removed by a patterning process, and hence the metal oxide semiconductor active layer 402 is formed in the active region.

Based on the above two implementation modes, compared with the second way of converting the entire film of the Cu metallic material into the film of the $Cu_2O$ semiconductor material at first and then removing the film of the $Cu_2O$ semiconductor material in the region other than the active region, the first mode is simpler. Therefore, the step of forming the metal oxide semiconductor active layer 402 of the $Cu_2O$ semiconductor material by the electrochemical reaction on the Cu metallic material, for instance, may be implemented by the following means: placing a substrate provided with a first pattern of the Cu metallic material in water and electrifying the first pattern, whereby the Cu metallic material is subjected to electrolytic reaction with the water to form the $Cu_2O$ semiconductor material, and the first pattern is formed into the metal oxide semiconductor active layer 402.

For instance, the manufacturing method further comprises: before the step of placing the substrate provided with the first pattern into water, forming the first pattern of the Cu metallic material in the active region by a patterning process.

Herein, as O elements have superior diffusion performance and spontaneous reaction characteristic in Cu, all of the Cu of the first pattern disposed in the active region may be converted into the $Cu_2O$ semiconductor material; and after all of the Cu in the active region is converted into $Cu_2O$, the current will be automatically turned off, and the electrolytic reaction process is ended.

It should be noted that: as the process of forming the first pattern into the metal oxide semiconductor active layer 402 is only to convert the Cu metallic material in the first pattern into the $Cu_2O$ semiconductor material, the first pattern and the metal oxide semiconductor active layer 402 are only different in material and are same in structure.

For instance, a pattern of the source electrode 501, a pattern of the drain electrode 502 and the first pattern which are arranged in the same layer are formed by a single patterning process.

Herein, after the first pattern is formed, as the process of forming the metal oxide semiconductor active layer 402 by the first pattern only needs the electrochemical reaction, the step of forming the pattern of the source electrode 501, the pattern of the drain electrode 502 and the first pattern by a single patterning process is namely that the source electrode 501, the drain electrode 502 and the metal oxide semiconductor active layer 402 are formed by a single patterning process. Therefore, compared with the way of forming the source electrode 501, the drain electrode 502 and the metal oxide semiconductor active layer 402 by two patterning processes, the embodiment of the present invention reduces the number of the patterning processes.

On this basis, compared with the way of additionally forming an etch barrier layer in order to avoid the influence on the metal oxide semiconductor active layer 402 when the source electrode 501 and the drain electrode 502 are etched, in embodiments of the present invention, as the first pattern for forming the metal oxide semiconductor active layer 402, the pattern of the source electrode 501 and the pattern of the drain electrode 502 are formed at the same time, the etch barrier layer is not required to be formed, and hence the number of the patterning processes can be further reduced. In addition, in the way of forming the etch barrier layer, as the source electrode 501 and the drain electrode 502 must be connected with the metal oxide semiconductor active layer 402, the etch barrier layer includes a first through hole through which the source electrode 501 and the metal oxide semiconductor active layer 402 are connected and a second through hole through which the drain electrode 502 and the metal oxide semiconductor active layer 402 are connected. Moreover, the first through hole and the second through hole cannot be too close in distance, thus the size of the TFT is limited. As the embodiment of the present invention has no limit in this aspect, the size of the TFT can be reduced, and hence the demand on high pixels per inch (PPI) can be satisfied.

Moreover, the step of forming the pattern of the source electrode 501, the pattern of the drain electrode 502 and the first pattern, arranged in the same layer, by a single patterning process, for instance, may be implemented by the following process: forming a Cu metal film on the substrate; and forming the pattern of the source electrode 501, the pattern of the drain electrode 502 and the first pattern disposed in the active region by performing a half-tone mask process on the Cu metal film. In the step, other patterns formed by the Cu metal film, except the first pattern, are covered by photoresist before electrochemical reaction is carried out.

For instance, the step of forming the pattern of the source electrode 501, the pattern of the drain electrode 502 and the first pattern disposed in the active region by performing a half-tone mask process on the Cu metal film may be implemented by the following steps S01 to S04. The steps will be described below in detail.

Figure 2A:
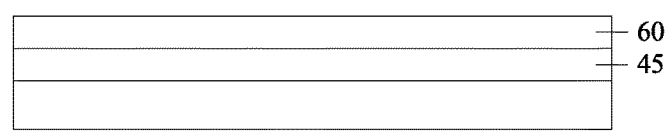
FIGS. 2a to 2e are schematic diagrams illustrating the process of forming the metal oxide semiconductor active layer, the source electrode and the drain electrode, in the method provided by an embodiment of the present invention.

S01: as illustrated in FIG. 2a, forming photoresist 60 on a substrate provided with a Cu metal film 45.

Figure 2B:
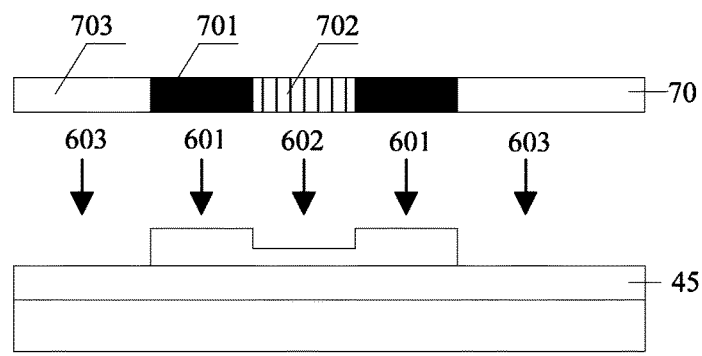

S02: as illustrated in FIG. 2b, forming photoresist-completely-retained portions 601, a photoresist-semi-retained portion 602 and photoresist-completely-removed portions 603 on the substrate obtained after the step S01 by performing exposure and development on the substrate provided with the photoresist via a half-tone mask 70 or a gray-tone mask. The photoresist-completely-retained portions 601 correspond to regions of the pattern of the source electrode 501 and the pattern of the drain electrode 502 to be formed; the photoresist-semi-retained portion 602 corresponds to the active region; and the photoresist-completely-removed portions 603 correspond to regions that are not to be provided with Cu metal patterns and other regions except the active region and the regions of the pattern of the source electrode 501 and the pattern of the drain electrode 502 to be formed.

As illustrated in FIG. 2b, the half-tone mask 70 includes completely opaque portions 701, a semitransparent portion 702 and completely transparent portions 703. For instance, the half-tone mask 70 refers to that: an opaque light-shielding metal layer is formed in some regions on a transparent base material; a semitransparent light-shielding metal layer is formed in some other regions; and no light-shielding metal layer is formed in other regions. The thickness of the semitransparent light-shielding metal layer is less than that of the completely opaque light-shielding metal layer. In addition, the transmittance of the semitransparent light-shielding metal layer with respect to, for instance, ultraviolet light, may be changed by the adjustment of the thickness of the semitransparent light-shielding metal layer.

On this basis, the working principle of the half-tone mask 70 is described below: the intensity of transmitted light exposed in different regions is different by controlling the thickness of the light-shielding metal layer in different regions on the half-tone mask 70, so that after the photoresist 60 is subjected to selective exposure and development, the photoresist-completely-retained portions 601, the photoresist-semi-retained portion 602 and the photoresist-completely-removed portions 603 respectively corresponding to the completely opaque portions 701, the semitransparent portion 702 and the completely transparent portions 703 of the half-tone mask 70 are formed.

The principle of the gray-tone mask is similar to the principle of the half-tone mask 70.

The embodiment of the present invention is illustrated by taking all the photoresist 60 as positive photoresist.

Figure 2C:
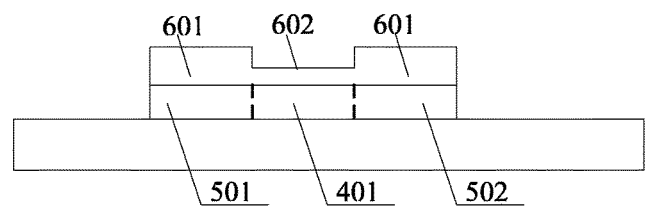

S03: as illustrated in FIG. 2c, forming the pattern of the source electrode 501, the pattern of the drain electrode 502 and the first pattern 401 disposed in the active region on the substrate obtained after the step S02 by removing the Cu metal film corresponding to the photoresist-completely-removed portions 603 by an etching process.

Figure 2D:
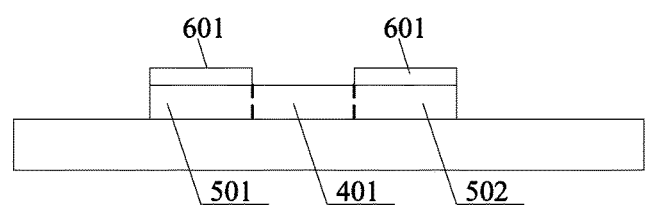

S04: as illustrated in FIG. 2d, removing the photoresist corresponding to the photoresist-semi-retained portion 602 on the substrate obtained after the step S03 by an ashing process.

Figure 2E:
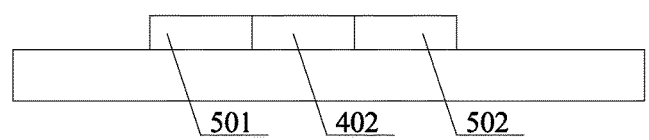

On the basis of the steps S01 to S04, the substrate obtained after the step S04 is placed in water and electrified, so that the exposed Cu metallic material in the first pattern 401 are subjected to electrolytic reaction with water to form the $Cu_2O$ semiconductor material, and hence the first pattern 401 is formed into the metal oxide semiconductor active layer 402. Moreover, after the photoresist in the photoresist-completely-retained portions 601 is removed, the structure as shown in FIG. 2e, in which the source electrode 501, the drain electrode 502 and the metal oxide semiconductor active layer 402 are arranged in the same layer, is obtained.

It should be noted that: FIGS. 2a to 2d only illustrate the process of forming the source electrode 501, the drain electrode 502 and the metal oxide semiconductor active layer 402; and as for the TFT, as illustrated in FIG. 1a, the gate electrode 20 and the gate insulating layer 30 may be formed on the substrate 10 before the source electrode 501, the drain electrode 502 and the metal oxide semiconductor active layer 402 are formed. Of course, as illustrated in FIG. 1b, the gate electrode 20 and the gate insulating layer 30 may be formed after the source electrode 501, the drain electrode 502 and the metal oxide semiconductor active layer 402 are formed. No limitation will be given here.

Based on the above, when $Cu_2O$ of the metal oxide semiconductor active layer 402 is formed by the electrochemical reaction on Cu, for instance, the gate insulating layer 30 at least includes a $TiO_2$ and/or $Al_2O_3$ layer in contact with the metal oxide semiconductor active layer 402.

As $TiO_2$ or $Al_2O_3$ can be well bonded with Cu metal, the $TiO_2$ or $Al_2O_3$ layer is arranged on, for instance, the upmost layer of the gate insulating layer 30, so that the subsequently formed Cu metal film can be well bonded with the substrate, and hence the formed metal oxide semiconductor active layer 402 of the $Cu_2O$ material has more stable performance.

The embodiment of the present invention further provides a method for manufacturing an array substrate, which comprises the foregoing method for manufacturing the TFT.

Figure 3:
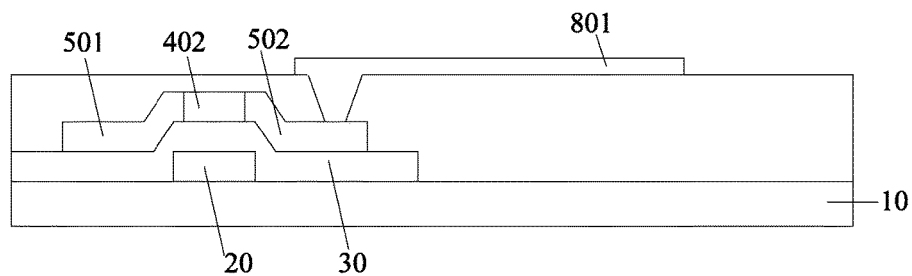
FIG. 3 is a schematic structural view 1 of an array substrate provided by an embodiment of the present invention.

For instance, the array substrate provided by the embodiment of the present invention may be an array substrate of an LCD. In this case, the method for manufacturing the array substrate may further comprise: forming pixel electrodes 801 electrically connected with the drain electrodes 502 as shown in FIG. 3.

Moreover, the array substrate provided by the embodiment of the present invention is applicable for the production of advanced super dimensional switching (ADS) LCD devices. The core technical characteristic of the ADS technology is that: multi-dimensional electric fields are formed by electric fields produced at edges of slit electrodes in the same plane and electric fields produced between a slit electrode layer and a plate electrode layer, so that all of the aligned liquid crystal molecules between slit electrodes and over electrodes in a liquid crystal cell can rotate, and hence the working efficiency of the liquid crystals and the transmittance can be improved. The ADS technology can improve the image quality of thin-film transistor liquid crystal display (TFT-LCD) products and has the advantages of high resolution, high transmittance, low power consumption, wide viewing angle, high aperture opening ratio, low color difference, no Push Mura, etc.

Figure 4:
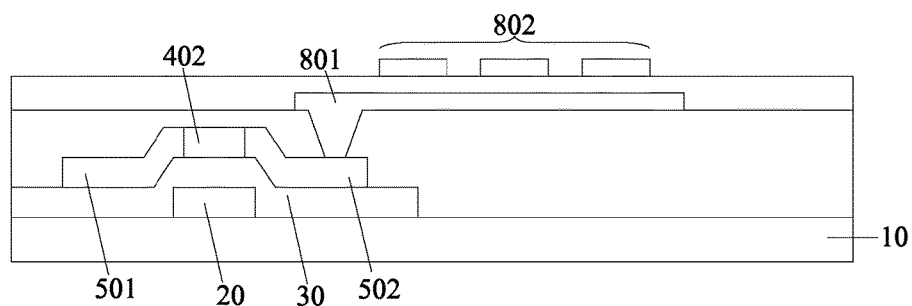
FIG. 4 is a schematic structural view 2 of the array substrate provided by an embodiment of the present invention.

Therefore, for instance, the method for manufacturing the array substrate may further comprise: forming common electrodes 802 and a passivation layer as shown in FIG. 4.

Figure 5:
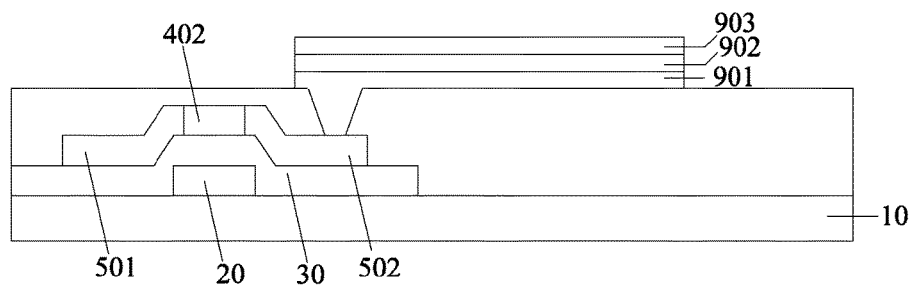
FIG. 5 is a schematic structural view 3 of the array substrate provided by an embodiment of the present invention.

Of course, the array substrate provided by the embodiment of the present invention may also be an array substrate of an OLED display. In this case, for instance, the method for manufacturing the array substrate may further comprise: forming an anode 901 electrically connected with the drain electrode 502, an organic material function layer 902 disposed on the anode 901, and a cathode 903 disposed on the organic material function layer 902, as shown in FIG. 5.

For instance, the organic material function layer 902 may include: a hole transport layer (HTL), an emission layer (EML) and an electron transport layer (ETL). For instance, in order to improve the efficiency of injecting electrons and holes into the EML, the organic material function layer may further include an electron injection layer (EIL) disposed between the cathode 903 and the ETL and a hole injection layer (HIL) disposed between the anode 901 and the HTL.

According to different materials of the anode 901 and the cathode 903, single-sided emission type array substrates and double-sided emission type array substrates may be divided. That is to say, when one of the anode 901 and the cathode 903 is of an opaque or semitransparent material, the array substrate is single-sided emission type; and when both the anode 901 and the cathode 903 are of a transparent material and/or semitransparent material, the array substrate is double-sided emission type.

As for the single-sided emission type array substrate, top-emission type and bottom-emission type may also be divided according to different materials of the anode 901 and the cathode 903. For instance, when the anode 901 is formed close to the base substrate 10, the cathode 903 being formed away from the base substrate 10, the anode 901 being of a transparent conductive material, and the cathode 903 being of an opaque conductive material, as light is emitted from the anode 901 and exits from one side of the base substrate 10, the array substrate may be referred to as bottom-emission type; and when the anode 901 is of an opaque conductive material and the cathode 903 is of a transparent or semitransparent conductive material, as light is emitted from one side of the cathode 903 and exits in a direction away from the base substrate 10, the array substrate may be referred to as top-emission type. Of course, the relative positions of the anode 901 and the cathode 903 may also be replaced. No further description will be given here.

As for the double-sided emission type array substrate, for instance, when the anode 901 is formed close to the base substrate 10, the cathode 903 being formed away from the base substrate 10, and both the anode 901 and the cathode 903 being of a transparent conductive and/or semitransparent material, as light is emitted from the anode 901 and exits from one side of the base substrate 10 on one hand and emitted from one side of the cathode 903 and exits in a direction away from the base substrate 10 on the other hand, the array substrate may be referred to as double-sided emission type. Herein, it is also applicable if the anode 901 is formed away from the base substrate 10 and the cathode 903 is formed close to the base substrate 10.

The embodiment of the present invention further provides a TFT. As illustrated in FIGS. 1a, 1b and 1c, the TFT comprises a gate electrode 20, a gate insulating layer 30, a metal oxide semiconductor active layer 402, a source electrode 501 and a drain electrode 502. The metal oxide semiconductor active layer 402 is formed by electrochemical reaction.

It should be noted that: firstly, the type of the TFT is not limited in the embodiment of the present invention, and the TFT may be bottom-gate type and may also be top-gate type.

Secondly, the relative positions of the metal oxide semiconductor active layer 402, the source electrode 501 and the drain electrode 502 are not limited, and the metal oxide semiconductor active layer 402, the source electrode 501 and the drain electrode 502 may be arranged in the same layer and may also be arranged in different layers.

Thirdly, the process of the electrochemical reaction and the material of the active region before electrochemical reaction are not limited, as long as the metal oxide semiconductor active layer 402 can be formed in the active region by electrochemical reaction.

Fourthly, in some embodiments, the TFT may comprise a substrate 10 and a gate electrode 20, a gate insulating layer 30, a metal oxide semiconductor active layer 402, a source electrode 501 and a drain electrode 502 arranged on the substrate 10. The substrate may be a base substrate not provided with any other structure and may also be a substrate provided with some layer structures.

The embodiment of the present invention provides a TFT, which comprises a gate electrode 20, a gate insulating layer 30, a metal oxide semiconductor active layer 402, a source electrode 501 and a drain electrode 502. The metal oxide semiconductor active layer 402 is formed by electrochemical reaction. Compared with the mode of coating the metal oxide semiconductor film on the substrate, the embodiment of the present invention provides a new method for manufacturing the metal oxide semiconductor active layer 402, wherein the method comprises etching the metal oxide semiconductor film in the regions other than the active region by a patterning process, to form the metal oxide semiconductor active layer disposed in the active region.

For instance, the metal oxide semiconductor active layer 402 is $Cu_2O$ semiconductor material.

As the metal oxide semiconductor active layer 402 is of $Cu_2O$, even though electrode material adopts Cu metal, the metal oxide semiconductor active layer 402 will not be sensitive to the diffusion effect of the Cu metal.

Moreover, for instance, as illustrated in FIGS. 1a and 1b, the metal oxide semiconductor active layer 402, the source electrode 501 and the drain electrode 502 are arranged in the same layer; and the source electrode 501 and the drain electrode 502 are of a Cu metallic material.

As $Cu_2O$ semiconductors may be formed by the electrochemical reaction on Cu metal, the pattern of the source electrode 501, the pattern of the drain electrode 502 and the pattern disposed between the pattern of the source electrode 501 and the pattern of the drain electrode 502, namely the above-mentioned first pattern 401, which are of a Cu metallic material and arranged in the same layer, may be formed by a single patterning process; subsequently, the Cu metallic material in the first pattern 401 may be converted into $Cu_2O$ semiconductor material by electrochemical reaction; and hence the first pattern 401 is formed into the metal oxide semiconductor active layer 402.

Herein, after the first pattern 401 is formed, as the process of forming the metal oxide semiconductor active layer 402 by the first pattern 401 only needs the electrochemical reaction, the step of forming the pattern of the source electrode 501, the pattern of the drain electrode 502 and the first pattern by a single patterning process is namely that the source electrode 501, the drain electrode 502 and the metal oxide semiconductor active layer 402 are formed by a single patterning process. Therefore, compared with the mode of forming the source electrode 501, the drain electrode 502 and the metal oxide semiconductor active layer 402 by two patterning processes, the embodiment of the present invention reduces the number of the patterning processes.

On this basis, compared with the mode of additionally forming an etch barrier layer in order to avoid the influence on the metal oxide semiconductor active layer 402 when the source electrode 501 and the drain electrode 502 are etched, in the embodiment of the present invention, as the first pattern for forming the metal oxide semiconductor active layer 402, the pattern of the source electrode 501 and the pattern of the drain electrode 502 are formed at the same time, the etch barrier layer is not required to be formed, and hence the number of the patterning processes can be further reduced. In addition, in the mode of forming the etch barrier layer, as the source electrode 501 and the drain electrode 502 must be connected with the metal oxide semiconductor active layer 402, the etch barrier layer may include a first through hole through which the source electrode 501 and the metal oxide semiconductor active layer 402 are connected and a second through hole through which the drain electrode 502 and the metal oxide semiconductor active layer 402 are connected. Moreover, the first through hole and the second through hole cannot be too close in distance, thus the size of the TFT is limited. As the embodiment of the present invention has no limit in this aspect, the size of the TFT can be reduced, and hence the demand on high PPI can be satisfied.

Moreover, for instance, the gate insulating layer 30 at least includes a $TiO_2$ and/or $Al_2O_3$ layer in contact with the metal oxide semiconductor active layer 402, the source electrode 501 and the drain electrode 502.

As $TiO_2$ or $Al_2O_3$ can be well bonded with Cu metal, the $TiO_2$ or $Al_2O_3$ layer is arranged on, for instance, the upmost layer of the gate insulating layer 30, so that the subsequently formed Cu metal film can be well bonded with the substrate, and hence the formed metal oxide semiconductor active layer 402 of the $Cu_2O$ material and the source electrode 501 and the drain electrode 502 of the Cu metallic material have more stable performance.

The embodiment of the present invention further provides an array substrate, which comprises the foregoing TFTs.

For instance, the array substrate provided by the embodiment of the present invention may be an array substrate of an LCD. In this case, as illustrated in FIG. 3, the array substrate may further comprise pixel electrodes 801 electrically connected with the drain electrodes 502.

Moreover, as illustrated in FIG. 4, the array substrate may further comprise common electrodes 802 and a passivation layer.

Of course, the array substrate provided by the embodiment of the present invention may also be an array substrate of an OLED display. In this case, for instance, as illustrated in FIG. 5, the array substrate further comprises an anode 901 electrically connected with the drain electrode 502, an organic material function layer 902 disposed on the anode 901, and a cathode 903 disposed on the organic material function layer 902.

As for the array substrate of the OLED display, one sub-pixel therein generally includes two TFTs, namely a switching TFT and a driving TFT; a gate electrode 20 of the switching TFT is electrically connected with a gate line; a source electrode 501 of the switching TFT is electrically connected with a data line; a drain electrode 502 of the switching TFT is electrically connected with a gate electrode 20 of the driving TFT; a source electrode 501 of the driving TFT is electrically connected with a power line; and a drain electrode 502 of the driving TFT is electrically connected with the anode 901.

Herein, it should be noted that no matter the TFT is a switching TFT or a driving TFT, the forming method thereof may adopt the foregoing method for manufacturing the TFT.

The embodiment of the present invention further provides a display apparatus, which comprises the foregoing array substrate.

For instance, when the array substrate may be an array substrate of an LCD, the display apparatus further comprise an opposing substrate (e.g., a color filter (CF) substrate) and a liquid crystal layer disposed between the array substrate and the opposing substrate.

When the array substrate is an array substrate of an OLED display, the display apparatus further comprise a package substrate.

The display apparatus provided by the embodiment of the present invention may be: any product or component with display function such as an LCD panel, e-paper, an OLED panel, an LCD TV, an LCD, a digital picture frame, a mobile phone, a tablet PC, and the like.

The foregoing is only the preferred embodiments of the present invention and not intended to limit the scope of protection of the present invention. The scope of protection of the present invention should be defined by the appended claims.

The application claims priority of the Chinese patent application No. 201510044070.1, filed on Jan. 28, 2015, the disclosure of which is incorporated herein by reference as part of the application.

What is claimed is:

1. A method for manufacturing a thin-film transistor (TFT), comprising: forming a gate electrode, a gate insulating layer, a metal oxide semiconductor active layer, a source electrode and a drain electrode on a substrate,
in which forming of the metal oxide semiconductor active layer comprises:
forming the metal oxide semiconductor active layer by electrochemical reaction, wherein the metal oxide semiconductor active layer is of a $Cu_2O$ semiconductor material, and wherein the metal oxide semiconductor active layer of the $Cu_2O$ semiconductor material is formed by the electrochemical reaction on a Cu metal film, wherein forming of the metal oxide semiconductor active layer further comprises:
forming the Cu metal film on the substrate;
forming a first pattern disposed in an active region by performing a single patterning process on the Cu metal film; and
forming the first pattern into the $Cu_2O$ semiconductor material by the electrochemical reaction.

2. The method according to claim 1, wherein forming of the metal oxide semiconductor active layer of the $Cu_2O$ semiconductor material by the electrochemical reaction on the Cu metal film comprises:
placing a substrate provided with the first pattern of the Cu metal film in water and electrifying the first pattern, whereby the Cu metal film is subjected to electrolytic reaction with the water to form the $Cu_2O$ semiconductor material, and the first pattern is formed into the metal oxide semiconductor active layer.

3. The method according to claim 2, wherein the first pattern of the Cu metal film is formed before the substrate provided with the first pattern is placed in water.

4. The method according to claim 3, wherein a pattern of the source electrode, a pattern of the drain electrode and the first pattern, which are arranged in a same layer, are formed by a single patterning process.

5. The method according to claim 4, wherein forming of the pattern of the source electrode, the pattern of the drain electrode and the first pattern, which are arranged on the same layer, by the single patterning process comprises:
forming the Cu metal film on the substrate; and
forming the pattern of the source electrode, the pattern of the drain electrode and the first pattern disposed in the active region by performing a half-tone mask process on the Cu metal film, in which except for the first pattern, other patterns made from the Cu metal film are covered by photoresist before the electrochemical reaction is performed.

6. The method according to claim 5, wherein forming of the pattern of the source electrode, the pattern of the drain electrode and the first pattern disposed in the active region by performing the half-tone mask process on the Cu metal film comprises:
forming photoresist on the substrate provided with the Cu metal film;
forming photoresist-completely-retained portions, a photoresist-semi-retained portion and photoresist-completely-removed portions after performing exposure and development on the substrate provided with the photoresist via a half-tone mask or a gray-tone mask, in which the photoresist-completely-retained portions correspond to regions of the pattern of the source electrode and the pattern of the drain electrode that are to be formed; the photoresist-semi-retained portion corresponds to the active region; and the photoresist-completely-removed portions correspond to regions that are not to be provided with Cu metal patterns and other regions, except for the active region;
forming the pattern of the source electrode, the pattern of the drain electrode and the first pattern disposed in the active region by removing the Cu metal film corresponding to the photoresist-completely-removed portions by an etching process; and
removing the photoresist in the photoresist-semi-retained portion by an ashing process.

7. The method according to claim 1, wherein the gate insulating layer at least comprises a $TiO_2$ and/or $Al_2O_3$ layer in contact with the metal oxide semiconductor active layer.

8. A method for manufacturing an array substrate, comprising forming a TFT on a substrate, wherein the TFT is formed with the method according to claim 1.

9. A method for manufacturing a thin-film transistor (TFT), comprising: forming a gate electrode, a gate insulating layer, a metal oxide semiconductor active layer, a source electrode and a drain electrode on a substrate,
wherein forming of the metal oxide semiconductor active layer comprises:
forming the metal oxide semiconductor active layer by electrochemical reaction, wherein the metal oxide semiconductor active layer is of a $Cu_2O$ semiconductor material, and wherein the metal oxide semiconductor active layer of the $Cu_2O$ semiconductor material is formed by the electrochemical reaction on a Cu metal film;
wherein forming of the metal oxide semiconductor active layer of the $Cu_2O$ semiconductor material by the electrochemical reaction on the Cu metal film comprises:
placing a substrate provided with a first pattern of the Cu metal film in water and electrifying the first pattern, whereby the Cu metal film is subjected to electrolytic reaction with the water to form the $Cu_2O$ semiconductor material, and the first pattern is formed into the metal oxide semiconductor active layer;
wherein before the substrate provided with the first pattern is placed in water, the method further comprises:
forming the first pattern of the Cu metal film in an active region by a patterning process;
wherein a pattern of the source electrode, a pattern of the drain electrode and the first pattern, which are arranged in a same layer, are formed by a single patterning process;
wherein forming of the pattern of the source electrode, the pattern of the drain electrode and the first pattern, which are arranged on the same layer, by the single patterning process comprises:
forming the Cu metal film on the substrate; and
forming the pattern of the source electrode, the pattern of the drain electrode and the first pattern disposed in the active region by performing a half-tone mask process on the Cu metal film, in which except the first pattern, other patterns made from the Cu metal film are covered by photoresist before electrochemical reaction is performed.

* * * * *